US010718810B2

(12) United States Patent
Kalgren et al.

(10) Patent No.: US 10,718,810 B2
(45) Date of Patent: Jul. 21, 2020

(54) POWER DRIVE TRANSISTOR RESONANCE SENSOR

(71) Applicant: Sikorsky Aircraft Corporation, Stratford, CT (US)

(72) Inventors: Patrick W. Kalgren, Conesus, NY (US); Kenneth Gravenstede, Lima, NY (US); Evan Grundman, Victor, NY (US); John Gorton, Webster, NY (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 307 days.

(21) Appl. No.: 15/736,608

(22) PCT Filed: Jun. 10, 2016

(86) PCT No.: PCT/US2016/036910
§ 371 (c)(1),
(2) Date: Dec. 14, 2017

(87) PCT Pub. No.: WO2016/205085
PCT Pub. Date: Dec. 22, 2016

(65) Prior Publication Data
US 2018/0180671 A1    Jun. 28, 2018

Related U.S. Application Data

(60) Provisional application No. 62/175,966, filed on Jun. 15, 2015.

(51) Int. Cl.
*G01R 31/315* (2006.01)
*G01R 31/28* (2006.01)
(Continued)

(52) U.S. Cl.
CPC ....... *G01R 31/315* (2013.01); *G01R 31/2837* (2013.01); *G01R 31/42* (2013.01); *G01R 33/022* (2013.01)

(58) Field of Classification Search
CPC .... G01R 31/315; G01R 31/42; G01R 33/022; G01R 31/2837
(Continued)

(56) References Cited

U.S. PATENT DOCUMENTS 6,566,636 B1 * 5/2003 Bentley .................. G05D 23/26
219/663
2007/0164723 A1    7/2007 Yanagisawa
(Continued)

FOREIGN PATENT DOCUMENTS

WO    WO-2014053187 A1    4/2014

OTHER PUBLICATIONS

International Search Report dated Sep. 30, 2016 for International Application No. PCT/US2016/36910.

*Primary Examiner* — Farhana A Hoque
(74) *Attorney, Agent, or Firm* — Cantor Colburn LLP (57) ABSTRACT

A Transistor Resonant Characteristic Sensor (TReCS) includes a sensing element positioned along electronic equipment so that the sensing element is electromagnetically coupled to the electronic equipment. The sensing element includes a coil. The sensing element is configured to detect magnetic oscillations associated with a characteristic signal generated by the electronic equipment. The TReCS sensor further includes an evaluation circuit connected to the sensing element for monitoring health state of the electronic equipment. The evaluation circuit includes one or more processing elements configured to diagnose health state of the electronic equipment based on extracted baseband information associated with the characteristic signal.

19 Claims, 4 Drawing Sheets (51) Int. Cl.
*G01R 31/42* (2006.01)
*G01R 33/022* (2006.01)

(58) Field of Classification Search
USPC ........................................ 324/750.3; 219/663
See application file for complete search history.

(56) References Cited

U.S. PATENT DOCUMENTS

| | | |
|---|---|---|
| 2009/0167457 A1* | 7/2009 | Melde ...................... H01P 5/04 333/32 |
| 2012/0299786 A1 | 11/2012 | Anguera et al. |
| 2014/0095102 A1 | 4/2014 | Potyrailo et al. |
| 2015/0077120 A1 | 3/2015 | Olsson et al. |

\* cited by examiner

POWER DRIVE TRANSISTOR RESONANCE SENSOR

CROSS REFERENCE TO RELATED APPLICATIONS

This application is the U.S. National Stage of PCT International Application No. PCT/US2016/036910, filed Jun. 10, 2016, which claims the benefit of U.S. Provisional Application No. 62/175,966, filed Jun. 15, 2015. The entire disclosure of each application is hereby incorporated herein by reference in its entirety.

STATEMENT OF GOVERNMENT RIGHTS

This invention was made with government support under Contract No. NNX11CA23C awarded by the NASA. The government has certain rights in the invention.

FIELD OF THE INVENTION

The present invention relates to prognostic health management of electronic systems, and more particularly, to a power drive transistor resonance sensor.

BACKGROUND OF THE INVENTION

With increased reliance on the operation of electronic equipment for day-to-day tasks, as well as the circuits and components within them, it is increasingly important to be able to assess not only the operating state of such equipment, but also if and when such equipment is experiencing degraded operation or is near failure and end of useful life. The ability to have condition based maintenance and prognostic health management capability on electronic systems, in order to monitor operating states, track performance, identify degraded performance and predict useful life is of significant advantage to the military as well as the commercial sector.

The prognostic health management technology typically utilizes both diagnostic and prognostic features to develop health indicators to assess the current health and predict the amount of useful life remaining of an electronic system. An electronic health indicator is a collection of one or more diagnostic features used to determine the overall lifetime (or health) of a system. An electronic health indicator is primarily used to determine the percentage of health remaining, or health index of a system. A prognostic feature is a collection of one or more diagnostic features used to measure the rate of degradation to predict the amount of time left remaining during the useful life of the system, also referred to as remaining useful life.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect a Transistor Resonant Characteristic Sensor (TReCS) is provided. The TReCS sensor includes a sensing element including a coil and positioned along electronic equipment so that the sensing element is electromagnetically coupled to the electronic equipment. The sensing element has a substantially fixed inductance and is configured to detect magnetic oscillations associated with a characteristic signal generated by the electronic equipment. The TReCS sensor further includes a measurement circuit connected to the sensing element for measuring the response of the sensing element. The measurement circuit is configured to perform a power scan of a band of electromagnetic frequencies and configured to generate a profile of the scanned band of electromagnetic frequencies.

In another aspect, the TReCS sensor includes a sensing element including a coil positioned along electronic equipment so that the sensing element is electromagnetically coupled to the electronic equipment. The sensing element is configured to detect magnetic oscillations associated with a characteristic signal generated by the electronic equipment. The TReCS sensor further includes an evaluation circuit connected to the sensing element for monitoring health state of the electronic equipment. The evaluation circuit includes one or more processing elements configured to diagnose health state of the electronic equipment based on extracted baseband information associated with the characteristic signal.

In yet another aspect, a method for monitoring the health state of electronic equipment using a TReCS includes acquiring a characteristic signal of interest generated by the electronic equipment using a sensing element of the TReCS. The sensing element is electromagnetically coupled to the electronic equipment. The sensing element includes a coil. The method further includes amplifying the acquired characteristic signal and filtering the acquired characteristic signal after amplification. The method further includes extracting baseband information from the filtered characteristic signal and diagnosing the health state of the electronic equipment, using one or more processing elements of the TReCS, based on the extracted baseband information.

BRIEF DESCRIPTION OF THE DRAWINGS

So that those having ordinary skill in the art, to which the present invention pertains, will more readily understand how to employ the novel system and methods of the certain illustrated embodiments, the embodiments thereof will be described in detail herein-below with reference to the drawings, wherein.

DETAILED DESCRIPTION OF CERTAIN EMBODIMENTS

It is to be appreciated that the below described embodiments are not limited in any way to what is shown in the Figures. and instead, can be embodied in various forms, as appreciated by one skilled in the art. Therefore, it is to be understood that any structural and functional details disclosed herein are not to be interpreted as limiting, but merely as a basis for the claims and as a representation for teaching one skilled in the art to variously employ the certain illustrated embodiments. Furthermore, the terms and phrases used herein are not intended to be limiting but rather to provide an understandable description of the certain illustrated embodiments.

Unless defined otherwise, all technical and scientific terms used herein have the same meaning as commonly understood by one of ordinary skill in the art to relating to below illustrated embodiments. Although any methods and materials similar or equivalent to those described herein can also be used in the practice or testing of the below illustrated embodiments, exemplary methods and materials are now described.

It must be noted that as used herein and in the appended claims, the singular forms "a," "an," and "the" include plural referents unless the context clearly dictates otherwise. Thus, for example, reference to "a stimulus" includes a plurality of such stimuli (and equivalents known to those skilled in the art) and reference to "the signal" includes reference to one or more signals (and equivalents thereof known to those skilled in the art), and so forth.

It is to be appreciated the certain embodiments described herein are preferably utilized in conjunction with a software algorithm, program or code residing on computer useable medium having control logic for enabling execution on a machine having a computer processor. The machine typically includes memory storage configured to provide output from execution of the computer algorithm or program. As used herein, the term "software" is meant to be synonymous with any code or program that can be in a processor of a host computer, regardless of whether the implementation is in hardware, firmware or as a software computer product available on a disc, a memory storage device, for download from a remote machine, etc.

As used herein, the term "characteristic signal" may refer to any ringing signal associated with electronic equipment. The term "ringing signal" is intended to refer to any suitable signature that when analyzed for features such as amplitude, frequency, envelope shape, and duration can be used to infer the state of its degradation.

As used herein, the term "processing device" is to be broadly construed to include any type of embedded processor.

Feature-based diagnostics and prognostics can be implemented for electronic systems by identifying key prognostic features that correlate with failure progression. Obtained features can be tracked and trended over system's life and compared with the model-based useful-life-remaining estimates. Utilizing sound engineering principles and building on diligent study of physical failure mechanisms, the disclosed component of an electronic prognostic system leverages signal characterization techniques as a basis for prognostic feature extraction.

In one exemplary embodiment, one ringing characterization technique may be utilized to measure the relative aging effects of switching transistors, diodes, and stator motor windings in standard power motors, for example. During a transition between off-to-on states for a transistor, such as an insulated gate bipolar transistor, the drain-to-source properties may be modeled as a switched capacitor for a short period of time. During this transition, oscillations are observed among the inductive load of the motor and the non-linear capacitive behavior of the semiconductor. According to an embodiment of the present invention, the oscillatory, or ringing, behavior can be computed, providing an opportunity to track the values of the power device parameters, such as ringing frequency. Measuring this quantity can provide valuable information indicative of system's health. This ringing characterization technique is further described in U.S. Pat. No. 8,103,463 incorporated by reference herein.

Figure 1:
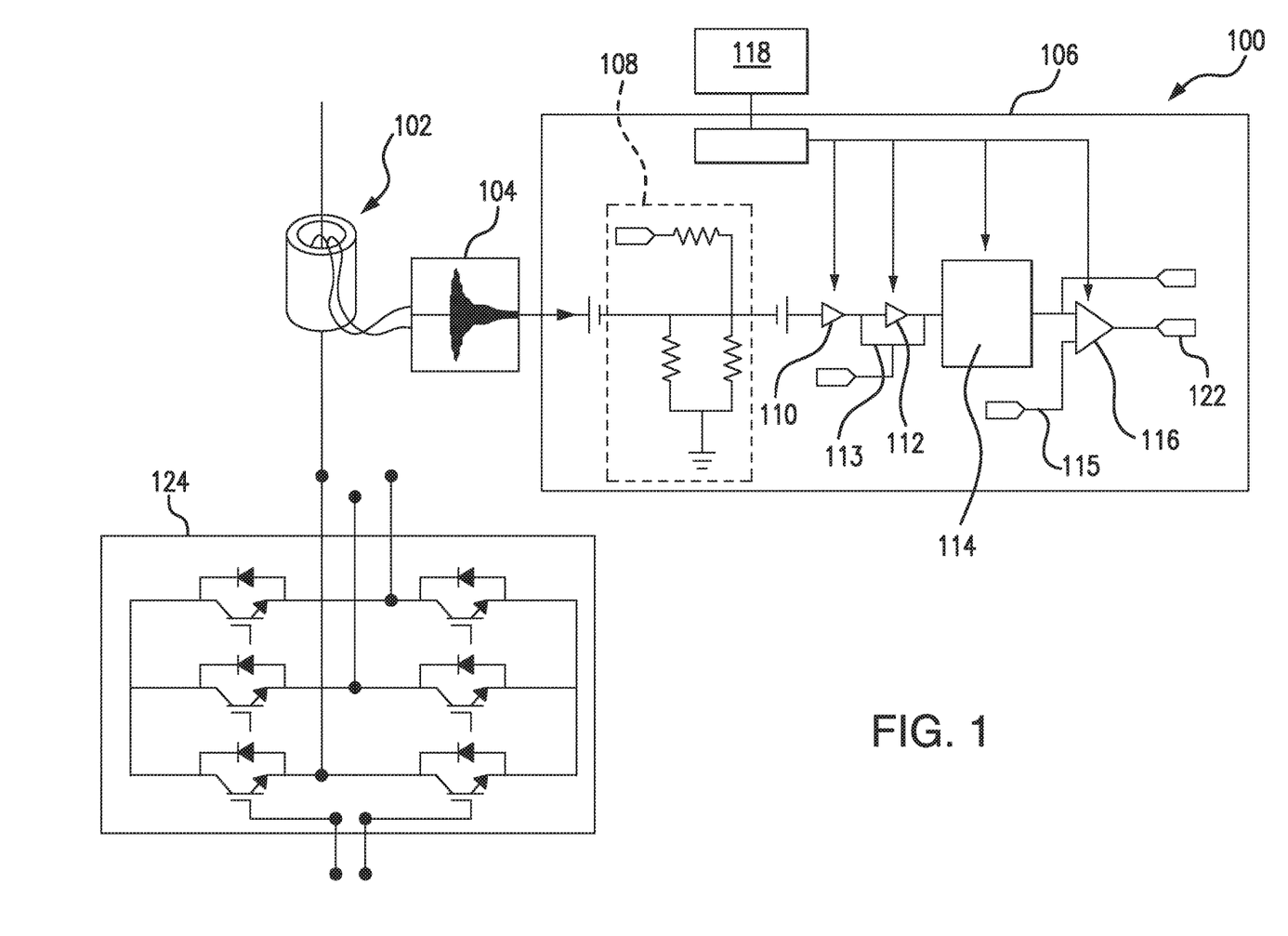
FIG. 1 is an illustration of an exemplary TReCS device which includes a sensing element electromagnetically coupled to electronic equipment and includes a corresponding measuring circuit, in accordance with an embodiment of the present invention.

Referring now to FIG. 1, there is illustrated an exemplary TReCS device which includes a sensing element electromagnetically coupled to electronic equipment and includes a corresponding measuring circuit, in accordance with an embodiment of the present invention. According to an embodiment of the present invention. TReCS device 100 includes a sensing element 102 positioned along an electronic equipment 124 so that the sensing element 102 is electromagnetically coupled to the electronic equipment 124. Sensing element 102 is configured to detect magnetic oscillations associated with a characteristic signal generated by the electronic equipment 124. The TReCS 100 further includes a measurement circuit 106 connected to the sensing element 102 for measuring the response of the sensing element 102.

It is possible to measure an electric current in electronic equipment by measuring the generated magnetic field with a coil positioned around or in close proximity to the electronic equipment being monitored. Such coils are known as Rogowski coils. According to an embodiment of the present invention, sensing element 102 may include a Rogowski coil. The magnetic field caused by the current flowing in the monitored equipment, such as electronic motor drive 124, induces a voltage between the ends of the coil sensor in proportion to the current flowing in the monitored equipment 124. The induced voltage (output signal 104 of the Rogowski coil 102) is read by a measurement circuit 106 for further processing, as described below. Particular advantages of using Rogowski coil as a sensing element 102 in various embodiments of the present invention are described in greater detail below.

According to one embodiment of the present invention, inductance of the Rogowski coil 102 is fixed and the measurement circuit 106 includes a signal tuning system (tuning system) that is operative, adapted and/or configured to receive a plurality of electromagnetic signals of varying frequencies and select or tune a particular frequency of interest. The tuning system includes a varactor 108 that is operative, configured and/or adapted to slide the resonant frequency up and down the spectrum. A varactor is a variable capacitor, i.e., a capacitor whose capacitance can be changed as a function of one or more control signals. The term "varactor" is derived from "variable" and "reactor", and means a device whose reactance can be varied in a controlled manner. The term "varicap", derived from "variable" and "capacitor", is also used to describe such a device. The varicap 108 receives output signals 104 generated by Rogowski coil 102.

As shown in FIG. 1, the tuning system of the measurement circuit 106 further includes a filter electronically connected in series with the varicap 108 to acquire a signal of interest. In one embodiment, the filter 110 is preferably, but not necessarily, an electronically tunable or adjustable filter 110 that utilizes a control signal such as a control voltage signal in order to change the filter or filtering characteristics thereof (i.e., a range of passband signals or bandpass frequency range and/or a center frequency of the passband frequency range). The tunable filter 110 of the measurement circuit 106 is tunable in its passband frequency range (bandpass frequency range) depending on the input impedance. Particularly, the frequency response of the filter 110 is adjustable in response to the impedance of Rogowski coil 102. Thus, the passband frequency range and/or a center frequency of the tunable filter may be adjusted. In accordance with the principles of the present invention, the passband frequency range and/or the center frequency of the filter 110 is adjusted with respect to a signal of interest.

According to an embodiment of the present invention, an amplifier 112 receives an electromagnetic signal from the tunable filter 110. The amplifier 112 amplifies the signal to generate an amplified electromagnetic signal. In an embodiment, the amplifier 112 includes a plurality of transistors (not shown) that may be arranged in one or more known configurations. It is noted that if the signal received from the tunable filter 110 is sufficiently strong, measurement circuit 106 routes the signal through a bypass path 113 which is not amplified.

The measurement circuit 106 of FIG. 1 also includes an envelope detector 114 to extract a modulation envelope signal from the amplified signal of interest. Examples of suitable envelope detectors include diode detectors, mixers, squaring cells, absolute value circuits, logarithmic amplifiers, and the like. The resulting analog baseband envelope signal is then applied to a single comparator 116 which compares the envelope signal generated by the envelope detector 114 with a reference signal 115 and produces a signal 122 indicating when the absolute difference between the envelope signal and the reference input signal 115 is greater than a reference voltage provided by a power supply 118.

Advantageously, the TReCS sensor 100 illustrated in FIG. 1 provides sufficient frequency response ceiling and bandwidth to detect the electromagnetic field oscillations generated by the characteristic ringing signal across a broad array of applications. In FIG. 1, sensing element 102 of TReCS sensor 100 is positioned along a small 3-phase motor 124 so that the sensing element 102 is electromagnetically coupled to the motor 124. In one embodiment, TReCS sensor 100 is configured to detect a signal having frequency of approximately 4.68 MHz, the characteristic frequency of the typical transistor used in typical small 3-phase motors 124.

In summary, an embodiment of TReCS sensor 100 illustrated in FIG. 1 employs a scanning methodology to capture one or more frequencies of interest (i.e., characteristic frequencies). The inductance of sensing element 102 (e.g., Rogowski coil) is fixed and the measuring circuit 106 utilizes the varicap 108 to slide the resonant frequency up and down the frequency band spectrum. The envelope detector 114 is further utilized to improve accuracy and sensitivity. Advantageously, the scanning methodology merely involves repeatedly tuning the varicap 108 and the analog output of the envelope detector 114, until the range of the varicap 108 is exceeded. At least in some embodiments, at each incremental setting, the frequency and the magnitude of the produced signal 122 are logged, effectively creating a spectrum profile. Thus, in one embodiment. TReCS sensor 100 essentially comprises a low cost frequency spectrum analyzer.

As would be readily apparent to a person of ordinary skill in the art, while the resonant sensors described herein are useful in characterizing the high frequency ringing signal of a switching transistor, they are not restricted in their applications just to transistors. Generally, various embodiments of the TReCS 100 can be configured to amplify the characteristic frequency of any electronic equipment item. Just as voltage and current sensors are normally installed on a commercial DC power system, a TReCS sensor 100 can be applied as a retro-fit or embedded within an electronic host system.

Various embodiments of the present invention contemplate numerous aerospace and terrestrial applications of TReCS 100 for monitoring of current transients in switched power circuitry. In light of these applications, certain requirements pertaining to TReCS sensors 100 are discussed below.

Aerospace systems, for example, place severe constraints on size, weight, efficiency and power consumption as the success of the platform hinges greatly on these parameters. Accordingly, at least in some embodiments, the size of TReCS sensor 100 should be sufficiently small to be readily embedded within any unit of an aerospace system. It is noted that power consumption of the TReCS device 100 will vary depending upon its application. For example, in systems' health monitoring domains, the health sampling rate can be rather low as the degradation phenomena take place over a physically long period of time (months to years). With a sampling interval on the order of hours, days or weeks, even a moderate burst power consumption rate can be reduced to an acceptable level. Conversely, arc-fault monitoring domains may require constant measurement and evaluation as the horizon to system failure can occur within a few seconds or less. In such cases it is desirable to minimize power consumption in order to preserve overall conversion efficiency.

With respect to algorithmic complexity, high frequency ringing response has been identified above as effective indicator of device aging. While such computation is not particularly demanding, it requires some control over the time interval being measured and potentially rejection of spurious or misleading signals which are present in any electronic system. Thus, at least in some embodiments, some form of general purpose computational device may be desired. A signal processing device, for example, can incorporate algorithms to suppress interference, customized to different applications or systems via a customized software module.

It is further noted that waveform features to be processed by the TReCS sensors 100, 300 (depicted in FIG. 3) described herein may vary significantly depending on the application. For a given feature, there may also be parametric variation such as overall time duration, frequency response, signal level and dynamic range. In addition, filtering requirements may vary to accommodate differences in electrical environment across various application domains. Therefore, to meet TReCS' 100, 300 application flexibility requirements the use of a general purpose computational device may be desirable as well. In some embodiments, a small set of alternate signal pathways may be required to provide pre-conditioning that is more favorable for some feature evaluations. For example, a different filter bandwidth may be necessary to handle lower sample rate processing.

Figure 3:
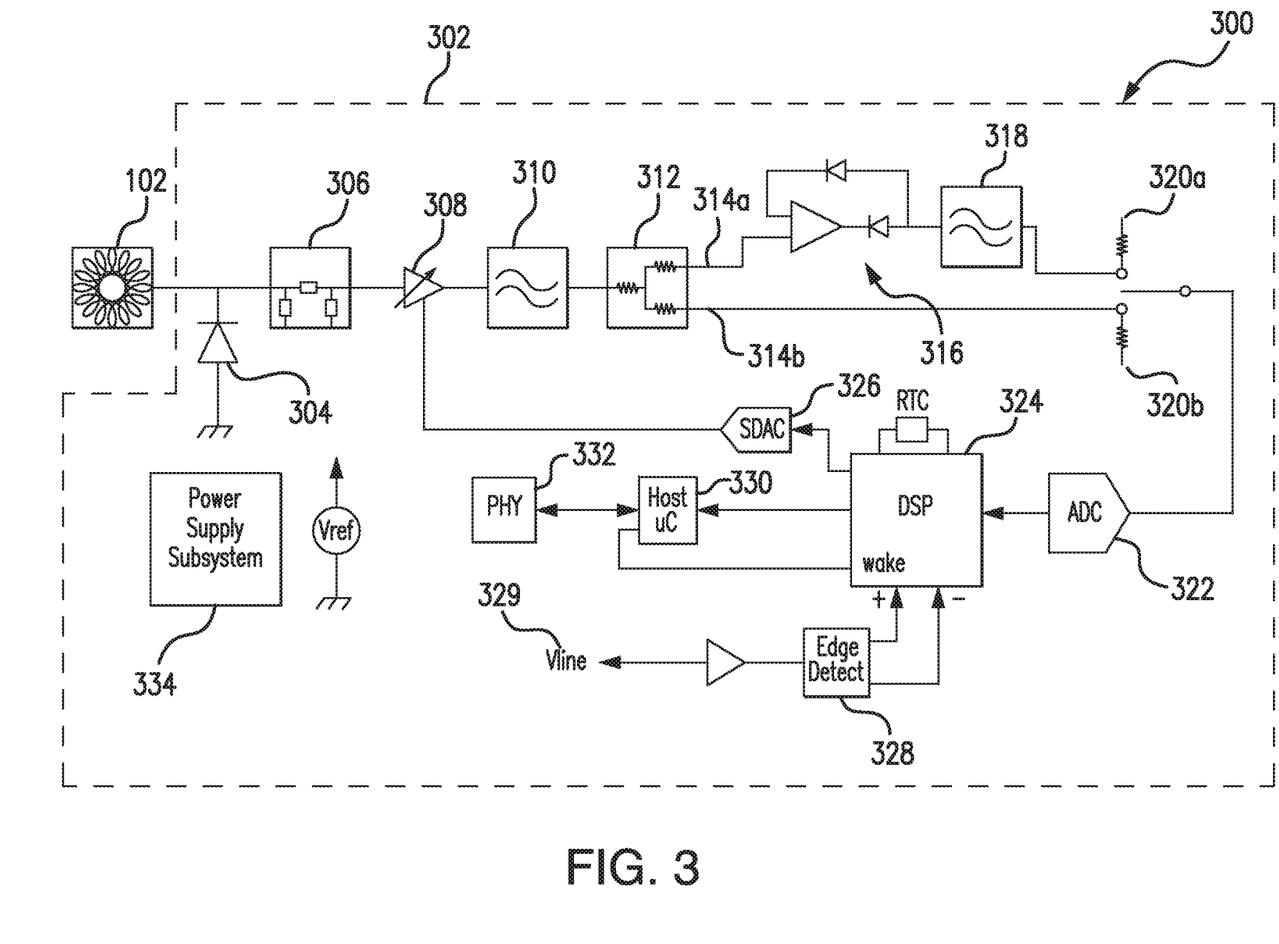
FIG. 3 is an illustration of an exemplary TReCS device which includes a sensing element electromagnetically coupled to electronic equipment and includes a corresponding evaluation circuit, in accordance with another embodiment of the present invention.

With respect to results communications, it is desirable for some TReCS sensors, such as TReCS 300 to communicate their health state findings to a higher level supervisory process. For terrestrial applications, TReCS sensors 300 may include a physical-layer connector. The physical layer connector may comprise a USB (Universal Serial Bus) connector, a RS-232 connector (serial connector with 3-wire or 5-wire), a RS-232 express connector, a RS-485 connector (TIA-485-A, ANSITIA/EIA-485, TIA/EIA-485, EIA-485 or RS-485ANSimA/EIA-485-A-1998 standard), a parallel connector (IEEE 1284 standard), a coaxial connector (transmission line for radio frequency signals), an optical connector (optic fiber), an Ethernet connector (IEEE 802.3 standard), a FireWire connector (IEEE 1394 standard). DSL (Digital Subscriber Line) connector, ADSL (Asymmetric Digital Subscriber Line) connector or a combination of any of these connectors. At the protocol layer, various control protocols supported by TReCS sensors 300 may comprise direct serial communications (ASCII or binary), Modbus and Controller Area Network (CAN) protocols. In aerospace applications, CAN protocol may be used as a data bus among other protocols such as SAFEbus®, ARINC 629, ARINC 429, Time-Triggered Protocol (TIP), MIL-STD-1553B, Intelli-Bus® and Avionics Full-Duplex Switched Ethernet (AFDX or ARINC 664). In various embodiments, this type of functional variation may be handled as a product configuration option.

Turning now to more specific design requirements, Rogowski coils were identified as being particularly advantageous to be used as a sensing element 102 of TReCS sensors 100. As illustrated in FIG. 1, in one embodiment, the Rogowski coil 102 is an air-cored toroidal coil which can be positioned near the electronic equipment 124. To provide accurate current readings, the Rogowski sensing element 102 preferably has a coil of uniform cross-section and constant turn density, i.e., uniform spacing between adjacent turns. The voltage output from the Rogowski coil 102 is given by the following expression (1):

$$V = \frac{-\pi a^2 N \mu_0}{2\pi R} \frac{dI}{dt}$$

in which a is the minor radius and R is the major radius of the coil. N is the number of turns, $\mu_0$ is the permeability of free space ($4\pi \times 10^{-7}$ Hm$^{-1}$) and dI/dt is the slew rate of the current in electronic equipment. It is assumed that no current flows in the coil. The expression shows that the Rogowski coil 102 responds only to changes in current, not, for example, changes in voltage.

Likewise, the self-inductance of the coil can be modeled from the inductance of a toroid and is given by the following expression (2):

$$L = \mu_0 N^2 (R - \sqrt{R^2 - a^2})$$

Thus, commercially available Rogowski coil sensing elements generally suffer from a trade-off between the strength of the signal output from the sensor and the bandwidth of the response. It is noted that for particular TReCS application areas this tradeoff between gain and self-inductance leaves sufficient room to design a coil with the desirable band pass characteristics. For example, in order to fit around the component legs of transistors, a relatively small 'a' parameter is desirable. Furthermore, to limit the inductance, the overall size of the loop R can be kept relatively small as well. This type of design limitation typically improves the voltage response as well as produces a lower inductance.

Figure 2:
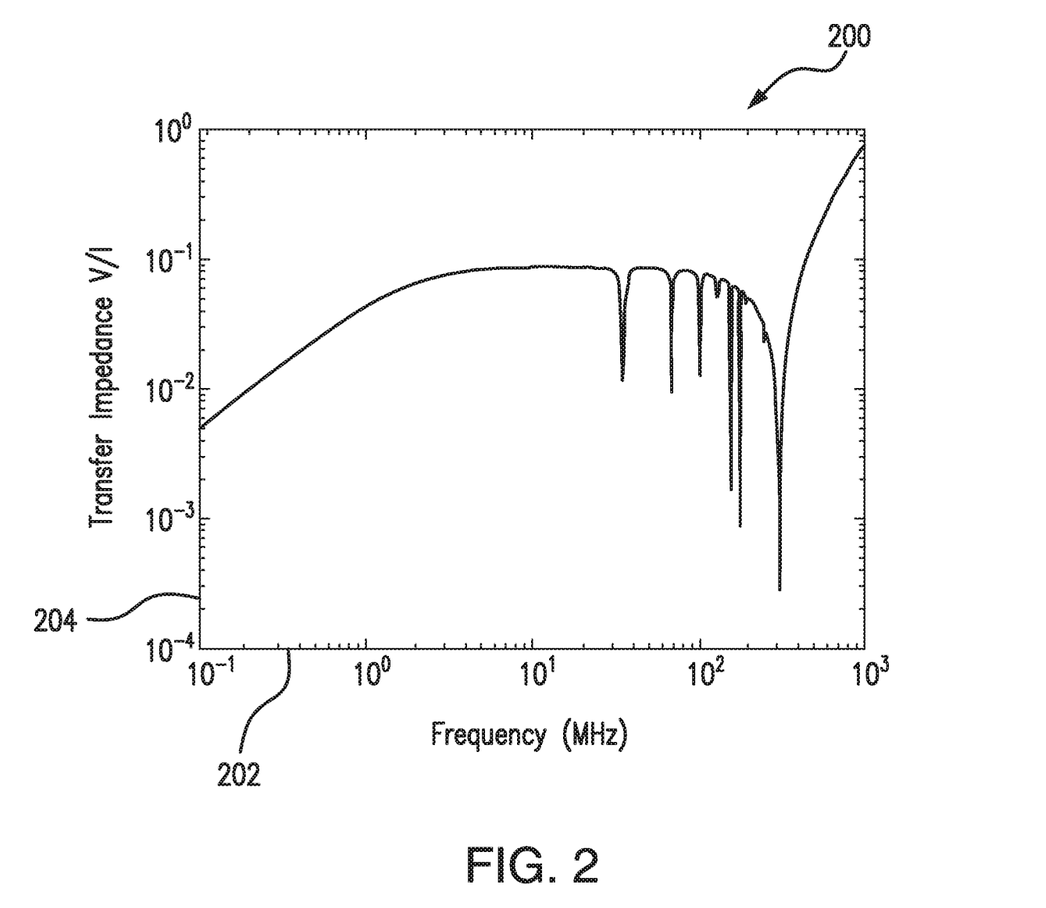
FIG. 2 is an exemplary plot depicting relationship of the transfer impedance to the frequency for an exemplary sensing element, in accordance with an embodiment of the present invention.

Thus, in an embodiment particularly useful for characterizing ringing behavior of transistors, an exemplary Rogowski coil may be utilized as sensing element 102 of TReCS 100 and 300, wherein the Rogowski coil has the following attributes: the small diameter of the coil (2a) is approximately equal to 3 mm, the overall toroid diameter (2R) is approximately equal to 120 mm and the number of turns is approximately equal to 256. FIG. 2 is an exemplary plot depicting relationship of the transfer impedance to the frequency for such exemplary embodiment of the Rogowski coil sensing element 102. FIG. 2 demonstrates a useable frequency band from approximately 1 MHz up to approximately 20 MHz. It is noted that this is consistent with spectral content of ringing signals measured for various switching devices.

In order to obtain an estimate of the required input range for TReCS sensors 100 and 300 described herein, one can utilize expression (1) above. By reviewing the current capacity of various transistor switching devices and their supported switching speeds, the expected minimum and maximum peak output voltages can be determined. Based on that information, one can compute the receiver input range. In one embodiment, the electrical transfer function of TReCS sensor 100 and 300 may be attained using the following expression (3):

$$V_{coil} = 5.79 \cdot 10^{-8} \frac{dI_{coil}}{dt}$$

Utilizing this transfer function along with the minimum and maximum switching rates for various devices known in the art, the resulting input range can be determined as shown in the table 1 below:

TABLE 1

| di/dt | Vcoil | Gain dB | gain for 1 V peak Gain |
|---|---|---|---|
| 1.15E+07 | 0.668 | 3.5 | 1.496236 |
| 4.00E+09 | 231.623 | −47.2 | 0.004365 |
| | INPUT RANGE 50.7 dB | | |

It is noted that in various embodiments, the absolute minimum and maximum gain values may vary from what is shown in the table above. However, in the preferred embodiment, the input range requirement should remain in the neighborhood of 50 dB.

FIG. 3 is a schematic illustration of another embodiment of the TReCS sensor 300. In this embodiment, TReCS sensor 300 also preferably includes a Rogowski coil 102 positioned around or in close proximity to the electronic equipment being monitored and further includes an evaluation circuit 302.

According to the embodiment illustrated in FIG. 3, some form of circuitry operable to protect the sensitive electronics of the evaluation circuit 302 against high voltage transients appearing on any electronic equipment being monitored or any other external transient events may be needed. To do so, a number of protection circuits 304 are well-known in the art, any combination of which can be implemented in the evaluation circuit 302 in a multitude of configurations. However, unwanted effects due to additional capacitance at the input of the evaluation circuit 302 may cause either degradation in performance, or at the extreme, total failure of the TReCS sensor 300. Thus, care must be taken both when designing the transient suppressors 304 and when placing them within the high frequency package to ensure that any spurious radio frequency energy present within the TReCS sensor 300 is kept to a minimum.

Because different frequency bands may be used for detection of ringing signals in different electronic devices, support for many different frequency bands is a desirable functionality to include for various embodiments of TReCS sensor 300. Preferably, the Rogowski coil 102 design should be executed in conjunction with a particular implementation of a broadband input matching network 306 that is designed to provide impedance matching between Rogowski coil 102 and other components of TReCS sensor 300 for the particular narrow band of interest.

According to an embodiment of the present invention, the evaluation circuit 302 of TReCS sensor 300 may include a gain control circuitry configured and operable to amplify the input signal in order to meet a particular input range requirement, such as input of approximately 50 dB illustrated in the table above. One embodiment of a gain control (or signal strength control) method for use in a TReCS 300 is schematically illustrated in FIG. 3. A voltage-controlled, variable gain amplifier 308 can be employed in the TReCS 300. The amplifier gain can be controlled to provide enough amplification to prevent under estimation of actual received signal due to noise floor. In one embodiment, one technique is to control the gain of the amplifier 308 to maintain constant signal strength (for example at 50 dB) at the input of an anti-aliasing filter 310.

In one embodiment, the variable gain amplifier 308 may include an analog-controlled impedance element. In particular implementation shown in FIG. 3 the impedance element of the variable gain amplifier 308 is an analog-controlled, variable impedance element and a Digital Signal Processor (DSP) 324 described below is coupled to a Serial Digital to Analog Converter (SDAC) 326, which converts the digital control signal to an analog control signal. The analog signal controls the impedance of variable gain amplifier's 308 impedance element. The impedance element is, for example, a voltage controlled impedance element and the analog control signal can provide a voltage that controls the impedance of the variable gain amplifier 308. In one embodiment, the variable gain amplifier 308 can be created by an AD8336 device which provides a gain range from approximately −14 dB to approximately +46 dB. It is noted that although a 14-bit Analog to Digital Converter (ADC) would have an approximately 84 dB dynamic range, the quantization error for small input signals is likely to be unacceptable for signal analysis in the disclosed TReCS 300. However, various embodiments of the present invention are not limited to the specific implementation of the variable gain amplifier 308 illustrated in FIG. 3. For example, techniques are known in the art for generating various types of modulation signals using direct digital synthesis (DDS). Thus, in alternative embodiment where a narrow band, higher frequency input signal is generated, the variable gain amplifier 308 can be preceded with a quadrature mixing device (not shown in FIG. 3) configured to operate at the desired output frequency. If the quadrature mixing device is employed, the SDAC 326 can be replaced with a DDS quadrature oscillator, for example.

According to an embodiment of the present invention, in order to prevent aliasing of noise above certain sampling frequency in the sampled signal acquired by the DSP 324, the evaluation circuit 302 of TReCS sensor 300 may include an anti-aliasing filter 310 that removes signals above a selected fixed cut-off frequency of the filter. In one illustrative embodiment, the target frequency cutoff is 10 MHz consistent with the anticipated spectral content from the switched device transients being monitored. In one exemplary embodiment, the anti-aliasing filter can be implemented as a fourth order filter with two cascaded biquads. For example, the fourth order filter may be implemented in a ladder configuration (not shown in FIG. 3). In this configuration the anti-aliasing filter 310 may have feedback between the two biquads. More specifically, the filter 310 may be implemented with two negative feedback loops from the output of the first op-amp in the second biquad to the input of the second op-amp in the first biquad.

It is noted that in some embodiments some form of integrator circuitry may be required to recover the original current waveform. In such embodiments, the anti-aliasing filter 310 may be replaced with a hand-limited integrator circuit (not shown in FIG. 3). In order to realize complete recovery, it is expected that the input signal is bounded in bandwidth, Ω, and amplitude, c.

According to an embodiment of the present invention, the anti-aliasing filter 310 is connected to a signal splitter 312. The signal splitter 312 divides the input signal power, and provides an output that splits into at least first 314a and second 314b paths. As shown in FIG. 3, the first path may include a full wave rectifier 316 connected to one output of the signal splitter 312. It is noted that a signal transmitted over the first path 314a comprises an AC signal. The output of the full wave rectifier 316 is a DC output signal transmitted to a low pass filter 318. Thereafter, the DC output signal produced by the full wave rectifier 316 is cleaned by means of the low-pass filter 318 of high-frequency noise components and may be further amplified as well. Accordingly, the first path 314a provides an envelope detection capability for analysis of waveforms at a lower sample rate. The envelope detection capability provides the capability of detecting an envelope of the characteristic signal at a lower sampling rate. The sampling rate should depend on the frequency limit of the low-pass filter 318. In one illustrative embodiment, the frequency limit of the low-pass filter 318 may comprise 1 MHz. The envelope detection at a lower sampling rate may be desirable when the high-frequency content of a waveform is not relevant, or when lower power operation of the signal processor, such as DSP 324, is desired. The output from the low pass filter 318 is applied to a first input of a switching assembly 320. It is noted that even though a full wave diode rectifier 316 is shown in FIG. 3, currently Shottky diodes and op-amp technologies do not support rectification of signals above around 100 kHz. Thus, in the alternate preferred exemplary embodiment, an RF detector chip (not shown in FIG. 3) may be utilized instead of the full waive diode rectifier 316. In one embodiment, the RF detector chip is preferably an analog device model AD8361.

According to an embodiment of the present invention, the second path 314b transmits a raw signal as received by the signal splitter 312. As shown in FIG. 3, the raw signal is provided to the switching assembly 320 as a second input. For example, the switching assembly 320 can be configured as a two-way integrated circuit absorptive switch, controllable by the DSP 324 to selectively provide either the envelope of the characteristic signal at a lower sampling rate or the raw signal to the DSP 324. The use of an absorptive switch configuration provides proper termination of the de-selected signal paths. When the switching assembly 320 is in a first position, the switching assembly 320a provides the signal transmitted over the first path 314a to the DSP 324 to allow the analysis of waveforms at a lower sample rate. When the switching assembly 320 is switched to a second position 320b, a raw signal is provided to the DSP 324. It will be appreciated that the switching assembly 320 can be selected to exhibit nearly identical insertion loss in both positions, and thus may be factored out of the analysis.

According to one embodiment of the present invention, thereafter, the selected signal may be converted to a baseband signal by generating a discrete-time signal comprising the baseband signal from periodic sampling of the signal. In the embodiment illustrated in FIG. 3 the evaluation circuit 302 preferably includes an analog-to-digital converter (ADC) 322 which produces a digital baseband signal at its output. The digital baseband output is demodulated and processed by the DSP 324. In an alternative embodiment, ADC 322 may be integrated with the DSP 324.

According to an embodiment of the present invention, the DSP 324 of TReCS sensor 300 is configured to provide signal processing with respect to digital representations of selected signals as provided by the ADC 322. For example, the DSP 324 of embodiments may process a digital representation of a characteristic signal or signals provided thereto to compute one or more values indicative of oscillatory, or ringing, behavior, such as ringing frequency. Information regarding the ringing frequency may be further analyzed by the DSP 324 to characterize the level of degradation and generate a health condition assessment of the monitored electronic equipment, such as the electronic motor drive 124 shown in FIG. 1. As previously indicated, this ringing characterization technique is further described in the U.S. Pat. No. 8,103,463 incorporated by reference herein.

At least in some embodiments, an edge detection circuit 328 may be included to provide a control of sample acquisition timing. An edge detection circuit 328 may provide input signals to the DSP 324. In other words, the DSP 324 preferably utilizes the clock signals provided by the edge detection circuit 324 to time the capturing of the characteristic electromagnetic signals by the TReCS sensor 300. In one embodiment, the line voltage $V_{line}$ 329 provides to the edge detector 328 an input signal within a desired voltage range. The edge detection circuit 328 will detect a rapidly rising edge in the input signal and generate an output pulse when an edge is detected. In one embodiment, the edge detector 328 will declare that an edge is present in the input signal when the signal includes a large enough voltage transition (0.5V, for example) with a rise time that is greater than a predetermined threshold (dv/dt>1 V/100 µs, for example).

As previously indicated, one of the outputs of the DSP 324 is coupled to the SDAC 326, which converts the digital control signal provided by the DSP 324 to an analog control signal which in turn controls the impedance of variable gain amplifier's 308 impedance element. As shown in FIG. 3, other outputs of the DSP 324 may be connected to a high performance microcontroller 330. In an embodiment of the present invention, the microcontroller 330 may include a Microprogrammed Control Unit (MCU) comprising a protocol conversion module. The protocol conversion module is configured to provide information to a physical layer connector 332, as it is desirable for TReCS sensors 100, 300 to communicate their health-state findings to a higher level supervisory process. In various embodiments, the physical layer connector 332 may support CAN, SAFEbus®, ARINC 629, ARINC 429, Time-Triggered Protocol (TTP), among many other protocols.

In an embodiment of the present invention, TReCS sensors 300 may optionally further include an integrated power supply subsystem 334. Depending on the particular embodiment, the power supply subsystem 334 may convert the provided supply voltage into, for example, an AC output, a DC-biased AC output, a rectified AC output, a rippled DC output, core voltage. In some embodiments, the power supply system 334 may convert the supply voltage into a voltage level of an output signal voltage provided to the physical layer connector 332. In an embodiment of the present invention, the integrated power supply subsystem 334 may also provide a precision voltage reference circuit for generating a constant reference voltage over a range of operating temperatures of TReCS sensors 300.

Figure 4:
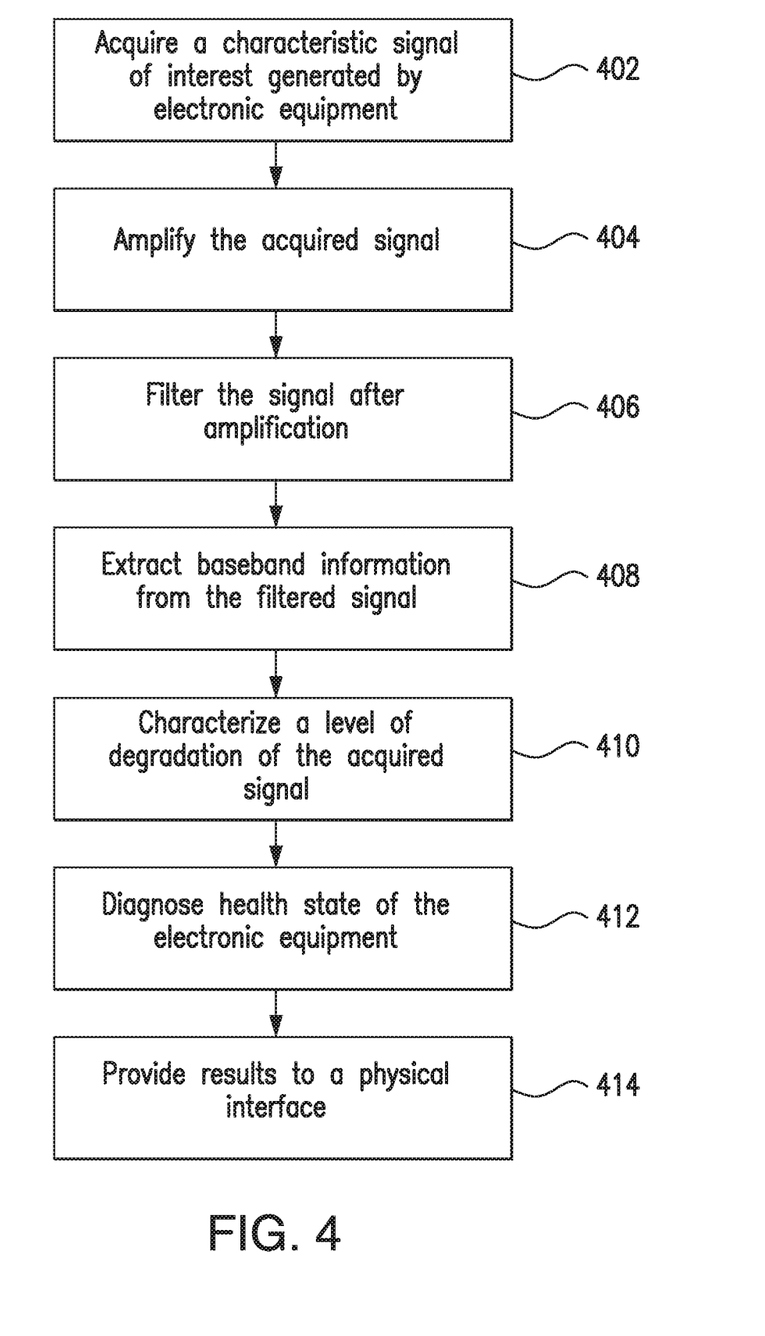
FIG. 4 is a flowchart depicting general operation of a TReCS sensor in accordance with an embodiment of the present invention.

The general operation of a TReCS device 300 included in an exemplary prognostic health monitoring system is set forth in the flowchart of FIG. 4 in accordance with an embodiment of the present invention. At step 402, the TReCS 300 begins the process by acquiring characteristic signal of interest values generated by the electronic equipment being monitored. There are several ways to acquire these values of interest. In a preferred embodiment. TReCS utilizes a sensing element 102 implemented as a Rogowski coil and positioned around or in close proximity to the electronic equipment being monitored. Advantageously, the Rogowski coil provides sufficient frequency response ceiling and bandwidth to detect the electromagnetic field oscillations generated by the characteristic ringing signal across a broad array of applications. Further advantages of Rogowski coil utilization in various embodiments of TReCS sensors 100, 300 are described above. The output signal of the Rogowski coil 102 is read by the evaluation circuit 302 for further processing, as described below.

The evaluation circuit 302 preferably includes tunable, filtering and bandwidth limitation elements to permit customization to the monitored system. At step 404, the evaluation circuit 302 amplifies the output signal provided by the Rogowski coil 102. In one embodiment, a voltage-controlled, variable gain amplifier 308 can be employed in the TReCS 300. The amplifier gain can be controlled to provide enough amplification to prevent under estimation of actual received signal due to noise floor. In one embodiment, one technique is to control the gain of the amplifier 308 to maintain constant signal strength (for example at 50 dB) at the input of the anti-aliasing filter 310. Next, after the amplification, at step 406, in order to prevent aliasing of noise above certain sampling frequency in the sampled signal acquired by the DSP 324, the evaluation circuitry 302 of the TReCS sensor 300 may remove signals above a selected fixed cut-off frequency by the anti-aliasing filter 310, for example. In one illustrative embodiment, the target frequency cutoff is 10 MHz consistent with the anticipated spectral content from switched device transients being monitored.

After amplifying and conditioning the characteristic signal acquired by the Rogowski coil 102, at step 408, this signal is converted to a baseband signal. In the embodiment illustrated in FIG. 3 the evaluation circuit 302 preferably includes the ADC 322 which produces a digital baseband signal at its output. Thereafter, the digital baseband output is demodulated and processed by the DSP 324. For example, the DSP 324 of embodiments may process a digital representation of a characteristic signal or signals provided thereto to compute one or more values indicative of oscillatory, or ringing, behavior, such as ringing frequency. Information regarding the ringing frequency may be further analyzed by the DSP 324, at step 410, to characterize the level of degradation of the monitored electronic equipment. At step 412, a health assessment is generated by the DSP 124, where a neural network, neural-fuzzy network, Bayesian network, causal network, rule-based system, or an expert system is used to combine the diagnostic features into a health assessment for the monitored electronic equipment. The health assessment identifies the source of the fault by isolating down to a component or a group of components, probability of overall system failure, and an estimate of the remaining useful lifetime (RUL) [e.g., in units of time or other time-related metric] of the system. The RUL is generated using trending analysis, quantitative state estimation techniques, and qualitative state estimation techniques.

At step 414, the health assessment is reported or sent to a third party hardware or software module either via a digital communication protocol or displayed to a human operator using visual indicators such as light-emitting diodes (LEDs) and electronic displays. In an embodiment of the present invention, step 414 may be performed by the microcontroller 330 comprising a protocol conversion module. The protocol conversion module is configured to provide information to the physical layer connector 332. In various embodiments, the physical layer connector 332 may support CAN, SAFEbus®, ARINC 629, ARINC 429, Time-Triggered Protocol (TTP), among many other communications protocols.

In summary, according to various aspects of the present invention, the disclosed TReCS sensor 100, 300 utilizes a Rogowski coil to provide sufficient frequency response ceiling and bandwidth to detect the electromagnetic field oscillation generated by the characteristic ringing signal across a broad array of applications. Advantageously, the TReCS 300 comprises an evaluation circuit 302 which includes tunable elements, filtering and bandwidth limitation circuitry to permit customization based on the monitored electronic equipment. The evaluation circuit 302 further incorporates embedded processing enabling characterization of the level of degradation of the monitored equipment and enabling generation of a corresponding heath condition assessment. Various embodiments of the present invention advantageously provide a novel TReCS sensor which is inexpensive, easy to manufacture, has excellent response properties, and is particularly adapted for efficiently solving previously encountered bandwidth and manufacturing limitations. One of the primary advantages of various embodiments is the ability to utilize the disclosed TReCS sensors 300 for real-time condition monitoring of a variety of high power drive electronic systems.

The techniques described herein are exemplary, and should not be construed as implying any particular limitation of the certain illustrated embodiments. It should be understood that various alternatives, combinations and modifications could be devised by those skilled in the art. For example, steps associated with the processes described herein can be performed in any order, unless otherwise specified or dictated by the steps themselves. The present disclosure is intended to embrace all such alternatives, modifications and variances that fall within the scope of the appended claims.

The terms "comprises" or "comprising" are to be interpreted as specifying the presence of the stated features, integers, steps or components, but not precluding the presence of one or more other features, integers, steps or components or groups thereof.

Although the systems and methods of the subject invention have been described with respect to the embodiments disclosed above, those skilled in the art will readily appreciate that changes and modifications may be made thereto without departing from the spirit and scope of the certain illustrated embodiments as defined by the appended claims.

What is claimed is:

1. A Transistor Resonant Characteristic sensor (TReCS), the TReCS sensor comprising:
   a sensing element comprising a coil and positioned along an electronic equipment so that the sensing element is electromagnetically coupled to the electronic equipment, wherein the sensing element has a substantially fixed inductance and is configured to detect magnetic oscillations associated with a characteristic signal generated by the electronic equipment; and
   a measurement circuit connected to the sensing element for measuring the response of the sensing element, the measurement circuit configured to perform a power scan of a band of electromagnetic frequencies and configured to generate a profile of the scanned band of electromagnetic frequencies, the measurement circuit comprising a variable capacitor (varicap) of adjustable resonance frequency, the varicap being configured to receive an input signal from the coil.

2. The sensor of claim 1, wherein the coil comprises a Rogowski coil.

3. The sensor of claim 2, wherein the the varicap is configured to receive the input signal from the Rogowski coil.

4. The sensor of claim 3, wherein the measurement circuit further comprises a filter electrically connected in series with the varicap to acquire a signal at the frequency of interest and wherein the frequency of interest is related to a resonance of the electric equipment being monitored.

5. The sensor of claim 4, wherein the measurement circuit further comprises an amplification element connected in series to the output of the filter to amplify the signal of interest.

6. The sensor of claim 5, wherein the measurement circuit further comprises an envelope detector to extract a modulation envelope signal from the amplified signal of interest.

7. The sensor of claim 1, wherein the Rogowski coil comprises a toroidal coil wound around a non-magnetic material core.

8. A Transistor Resonant Characteristic sensor (TReCS), the TReCS sensor comprising:
   a sensing element comprising a coil and positioned along an electronic equipment so that the sensing element is electromagnetically coupled to the electronic equipment, wherein the sensing element has a substantially fixed inductance and is configured to detect magnetic oscillations associated with a characteristic signal generated by the electronic equipment; and
   an evaluation circuit connected to the sensing element for monitoring health state of the electronic equipment, the evaluation circuit comprising one or more processing elements configured to diagnose health state of the electronic equipment based on extracted baseband information associated with the characteristic signal, the evaluation circuit comprising a voltage transient suppression circuit connected between the sensing element and a broadband impedance matching network.

9. The sensor of claim 8, wherein the broadband impedance matching network comprises a plurality of band pass filters configured to acquire signals in the passband of interest and wherein the broadband impedance matching network is coupled to an output of the sensing element.

10. The sensor of claim 9, wherein the evaluation circuit further comprises a variable gain amplifier configured to amplify the signals of interest, the variable gain amplifier connected in sequence to the broadband impedance matching network.

11. The sensor of claim 10, wherein the variable gain amplifier is configured to be controlled by a plurality of control signals generated by a Digital Signal Processor (DSP).

12. The sensor of claim 11, wherein a Serial Digital to Analog Converter (SDAC) is serially connected to an output of the DSP and wherein the SDAC is configured to generate a plurality of analog output signals corresponding to the plurality of control signals generated by the DSP.

13. The sensor of claim 12, wherein the evaluation circuit further comprises an analog antialiasing filter having a low-pass characteristic, wherein an input of the analog anti-aliasing filter is connected to an output of the variable gain amplifier and wherein the analog anti-aliasing filter is configured to remove out-of-band signals from the amplified signals of interest.

14. The sensor of claim 13, wherein an output of the analog anti-aliasing filter is serially connected to a signal splitter with an output that splits into at least two paths including a first path and a second path, wherein the first path comprises a circuit having a full wave diode rectifier with an output serially connected to a low pass filter and wherein the second path comprises a raw signal received from the analog anti-aliasing filter.

15. The sensor of claim 14, wherein the evaluation circuit further comprises an Analog to Digital Converter (ADC) selectively receiving as input a signal from the first path or the second path, the ADC outputting a digitized signal representing the input signal to the DSP and wherein the ADC is configured to extract baseband information from the received input signal.

16. The sensor of claim 15, wherein the DSP is configured to diagnose health state of the electronic equipment and wherein the DSP is configured to report the diagnosed health state information to one or more physical interfaces via a processing element comprising a protocol conversion module.

17. A method for monitoring health-state for electronic equipment using a Transistor Resonant Characteristic Sensor (TReCS), the method comprising:
   acquiring a characteristic signal of interest generated by electronic equipment using a sensing element of the TReCS, the sensing element comprising a coil electromagnetically coupled to the electronic equipment, the acquired characteristic signal being acquired using a voltage transient suppression circuit coupled to a broadband impedance matching network;
   amplifying the acquired characteristic signal;
   filtering the acquired characteristic signal after the amplification;
   extracting baseband information from the filtered characteristic signal; and
   diagnosing the health-state of the electronic equipment based on the extracted baseband information using one or more signal processing elements of the TReCS.

18. The method of claim 17, wherein diagnosing the health-state of the electronic equipment comprises characterizing a level of change of the acquired characteristic signal of interest generated by the electronic equipment.

19. The method of claim 17, further comprising providing the diagnosed health-state of the electronic equipment to a physical interface.

* * * * *